United States Patent [19]
Calviello et al.

[11] Patent Number: 4,789,645
[45] Date of Patent: Dec. 6, 1988

[54] METHOD FOR FABRICATION OF MONOLITHIC INTEGRATED CIRCUITS

[75] Inventors: Joseph A. Calviello, Kings Park; Paul R. Bie, Commack; Ronald J. Pomian, Dix Hills, all of N.Y.

[73] Assignee: Eaton Corporation, Cleveland, Ohio

[21] Appl. No.: 40,418

[22] Filed: Apr. 20, 1987

[51] Int. Cl.$^4$ .................... H01L 29/48; H01L 21/283
[52] U.S. Cl. .................... 437/51; 148/DIG. 14; 148/DIG. 21; 156/652; 156/656; 156/662; 430/316; 357/51; 357/41; 437/59; 437/60; 437/177; 437/184; 437/192; 437/195; 437/912; 437/919; 437/926
[58] Field of Search .................... 148/DIG. 14, 20, 72, 148/139, 140; 156/652, 656, 662, 649, 610, 611, 613; 437/39, 44, 77, 126, 110, 177, 184, 190, 192, 203, 245, 246, 947, 133; 430/314–316, 318; 357/56, 67, 71, 22 I, 22 K

[56] References Cited

U.S. PATENT DOCUMENTS

| | | | |
|---|---|---|---|
| 3,808,041 | 4/1974 | Rosenberger et al. | 437/246 |
| 3,900,944 | 8/1975 | Fuller et al. | 437/246 |
| 4,179,533 | 12/1979 | Christou et al. | 437/177 |
| 4,236,829 | 12/1980 | Chikamura et al. | 357/16 |
| 4,301,233 | 11/1981 | Calviello | 437/177 |
| 4,310,570 | 1/1982 | Calviello | 156/662 |
| 4,312,112 | 1/1982 | Calviello | 437/39 |
| 4,316,201 | 2/1982 | Christou et al. | 357/71 |
| 4,319,258 | 3/1982 | Harnagel et al. | 357/71 |
| 4,325,073 | 4/1982 | Hughes et al. | 357/22 |
| 4,325,181 | 4/1982 | Yoder | 437/133 |
| 4,381,595 | 5/1983 | Denda et al. | 357/71 |
| 4,471,005 | 9/1984 | Cheng et al. | 437/246 |
| 4,514,751 | 4/1985 | Bhattacharya | 357/67 |
| 4,519,127 | 5/1985 | Arai | 437/30 |
| 4,534,099 | 8/1985 | Howe | 357/71 |
| 4,617,724 | 10/1986 | Yokoyama et al. | 437/133 |

OTHER PUBLICATIONS

Calviello et al., "Quasi-Monolithic . . . ", Microwave Journal, May 1986, pp. 243-258.
Calviello et al., "First Successful Fabrication of High--Performance All-Refractory-Metal, (Ta-Au) GaAs FET. . . ", Electronics Letters, May 8, 1986, vol. 22, No. 10, pp. 510-512.
Meier et al., "Integrated Ka-Band Front End with Monolithic Mixer", abstract only, 1985, IEEE MTT-S International Microwave Symposium, pp. 151-154.
Tsaur et al., "Molecular Beam Epitaxy of GaAs and AlGaAs on Si", Appl. Phys. Lett. 45(5), Sep. 1, 1984, pp. 535-536.

*Primary Examiner*—Brian E. Hearn
*Assistant Examiner*—William Bunch
*Attorney, Agent, or Firm*—V. J. Ranucci

[57] ABSTRACT

During fabrication of monolithic microwave integrated circuits, active devices having sources, gates, drains, and/or Schottky barrier junctions are first provided for an epitaxial layers. Then many layers of metals and oxides are produced thereover in situ without removing the circuit from its environmental chamber. Circuit elements are then defined by processing of the many layers sequentially by photolithography and other processes from the top of the chip downward. Certain combinations of metals, oxides, and processes are selected to enable fabrication of circuits from the top down in this way. This reduces inclusion of contaminating chemical films and particles between the desired layers. Lumped and distributed capacitors, resistors, inductors, transmission lines, contacts, and complete active devices are monolithically defined, with a reduced number of process steps. An all-refractory MESFET is described, having a Schottky barrier gate and nonalloyed ohmic contacts for source and drain producible at room temperatures. Source, gate, and drain can be defined with a single mask. A thinner gold layer is formed for FET contacts than for other circuit conductors and elements by means of a configured tantalum layer buried in a thick gold layer.

39 Claims, 7 Drawing Sheets

METHOD FOR FABRICATION OF MONOLITHIC INTEGRATED CIRCUITS

FIELD

This invention relates to monolithic semiconductor circuits having active and passive components, including circuits suitable for operation at microwave and millimeter signal wavelengths, and processes for fabricating such circuits.

PRIOR ART

Diffusion and other processes have been used to fabricate monolithic microwave integrated circuits (MMICs) on a single chip of silicon. MMICs fabricated on GaAs substrates by such prior processes have shown very promising characteristics. Those fabricated by batch processes can have very high performance, but yields are low. When more fully developed, this family of processes is expected to be very economical for mass production of certain products.

Broadly speaking, the prior MMIC structures have been fabricated from the bottom up, that is, by starting at a stratum at or slightly below the "top" surface of the substrate and proceeding upward to superstructure layers. Because of the nature of the metallurgies and sequences of processing operations employed, the prior art circuits have ordinarily been removed from processing chambers many times during their fabrication, and so have been exposed to atmospheres more contaminated than those within the processing chambers. Contaminants such as chemical films and dust particles from the ambient environment have drastically reduced the yields, reliability, and performance.

SUMMARY

One object is to provide a fabrication method for producing monolithic integrated circuits with higher yield and improved performance, for use as microwave and millimeter circuits.

Another object is the development of a technology base including substrates, metallurgy, oxides, and processes to enable fabrication of MMICs that are more cost effective because contamination between layers is reduced.

An object is to provide a method for fabricating monolithic integrated circuits in which the sequence in which circuit elements are fabricated and the metallurgy and processes employed enable a great amount of fabrication processing without removing the integrated circuit from the environmental chamber in which many steps of the processing takes place.

An object is to provide a method for fabricating monolithic integrated circuits in which the metallurgy and processes employed and the sequence in which circuit elements are fabricated are selected so as to enable production of the products with fewer steps.

An object is to provide a method for producing semiconductor circuits in which performance of subcircuits within a wafer is improved and subcircuits are more uniform among wafers.

An object is to adapt a fully plasma dry etch process to the fabrication of monolithic microwave integrated circuits.

An object is to provide fabrication methods employing in situ deposition for producing MMIC semiconductor circuits in which Ta, $Ta_2O_5$ and Au metallurgy are adopted for fabricating R's, L's, C's (both interdigitated and overlayer C's), distributed networks, microstrip circuits, and active devices.

An object is to provide monolithic integrated circuits having different thicknesses of conductive layers (such as gold) in the areas that are devoted to some circuit elements (such as FETs), than in areas devoted to other elements (such as transmission lines).

An object is to enable fabrication of a monolithic FET using a single mask for defining the gate, source, and drain, so as to improve alignment of these electrodes and greatly reduce the number of steps in the fabrication.

An object is to provide a method for fabricating at room temperature monolithic integrated circuits having active and passive elements.

An object is to provide a method for fabricating monolithic integrated circuits having only refractory metals in the design of the gates, sources, and drains of its FETs.

An object is provide a method for fabricating monolithic integrated circuits having an FET and nonalloyed contacts thereof that serve as diffusion barriers to prevent diffusion of gold into the active channel of the FET.

BRIEF DESCRIPTION OF THE DRAWINGS

FIG. 2 illustrates a stage in the top-down process for producing an MMIC.

DETAILED DESCRIPTION

The successful development of cost effective and high performance monolithic integrated circuits, such as monolithic microwave circuits, required improvements in processes, metallurgy, circuit design and configuration, including the following.

(a) Development of a plasma dry etch process to achieve uniformity over a full wafer surface.

(b) Reliable metallurgy that is diffusion resistant to GaAs, Au, and to neighboring metals (as in multi-level metallization), and is easily bondable.

(c) The processes and metallurgy used in the passive circuit elements should be very similar to those used for fabrication of the active devices involved, e.g., diodes and low noise and power FETs.

(d) The number of times that the MMIC is removed from the processing chambers should be minimized to reduce contamination.

(e) The number of heating cycles to high temperatures should be minimized to reduce thermal stress damage.

(f) Thick conductive layers should be provided to minimize losses due to skin effect in circuit networks, and thinner layers should be provided for contact to the electrodes of active devices.

(g) For good microwave performance the substrate should be semi-insulating gallium arsenide (SI GaAs), or GaAs on a high resistivity substrate, etc.

One factor in fulfilling these requirements is the selection of Ta, Mo, W, Ta/Si, Mo/Si, W/Si, Ta/N, Mo/N, or W/N as a metallurgy system for the Schottky junctions, with a thick gold overlayer. Another factor is the development of various passive and active circuit elements on SI GaAs using that metallurgy, as explained further below.

The system of metallurgy that was devised made it possible to fabricate lumped R's, L's and C's (including both interdigitated and overlayer capacitors) distributed components and networks, and microstrip circuits, Schottky contacts and complete active elements by means of almost completely in situ deposition of the necessary metal and oxide layers. For the system of the example described below, Ta, $Ta_2O_5$ and Au were adopted, but other compounds such as $SiO_2$, $Si_3N_4$, etc. could be used as well. A fully plasma dry etch process was employed to fabricate passive and active devices.

By the use of this invention semiconductors including MMICs operable in the microwave to millimeter wavelength ranges are produced by performing many steps of their fabrication without removing them between those steps from the chamber in which they are processed. This type of fabrication was made possible by devising ways to perform a few operations necessary for active devices, then to produce many layers of various materials on the substrate, in situ within the chamber, and to define the elemental structures of the circuit from the top down. The processes and metallurgies are selected to enable such a sequence of fabrication.

Thus, multiple layers of metals and oxides are deposited successively in situ. The superimposed layers are produced sequentially in a chamber that serves as a high vacuum system, sputtering system, and/or other processing system, without removing the semiconductor circuit from the chamber. This reduces the exposure of the desired layers to contaminants such as chemical films and dust particles. The number of layers deposited in situ can be very great, e.g. ten or more if desired, to accommodate multiple layers of capacitors and other circuit elements.

Photolithography and other processes are then performed upon the layers of materials that were deposited earlier, working from the top down, to define circuit elements. They include passive circuit elements, both distributed and lumped, and Schottky contacts and barriers for gates, drains, sources, etc., to enable complete formation of circuits including active devices such as FETs and diodes. The photolithographic processes themselves are well known in the prior art and need not be described in detail here.

The reduction of contaminants between layers increases the yield, reliability and performance of the products. Moreover, for some products the number of fabrication processes is reduced by this method.

Another aspect of the invention is the use of a buried layer of tantalum having gold both below it and above it, with the Ta covering some areas of the substrate and not others according to a mask pattern. In the final product, the buried Ta layer makes it possible to have a thin gold layer in the areas that it covers, (the remaining gold there being only the portion that was originally below the Ta), and the thicker layer elsewhere. The thin layer of gold enables high resolution in defining small electrodes of high performance FETs. The thicker layer in other areas accommodates greater skin depths for conductors and other inactive circuit elements, so as to reduce the power losses. The thicker layer could be 25% thicker than the layer over the FET electrodes, or 100% thicker, or whatever extra thickness is desired.

For large overlayer capacitors, prior methods suffered from excessive dust particles and chemical contaminants on the wafers' surfaces, especially if the processing area in which the circuits were fabricated was only of class 10,000 cleanliness or poorer. When many or all of the metal and oxide layers necessary for defining the lumped elements (R's, L's and C's) are deposited in situ, dust and chemical contamination between deposited layers are greatly reduced, resulting in overlayer capacitors having excellent Q's and yield. For example, the Q at 2 GHz for a 0.6 pf capacitor made by this process is near 150 and for a 5 pf capacitor Q is greater than 14, with an associated yield greater than 95%. Dielectric constants for the capacitors can be controlled by selection of the integers X, Y, and Z in the formula $Ta_XSi_YO_Z$, or by using other dielectrics such as $SiO_2$, $Si_3N_4$, etc.

Further explanation of the invented method is facilitated by describing examples of circuits that were produced by it.

An All-Refractory MMIC Having a MESFET With Nonalloyed Ohmic Contacts.

An example of an MMIC produced by the invented method is one that includes an All Refractory metal type of metal silicon field effect transistor (MESFET), referred to as an ARFET. (Refractory metals are those which resist change of shape, weight or physical properties at high temperatures.) The fabrication of the MMIC having an ARFET is shown in FIGS. 1 through 8. The FET's semi-insulating (SI) GaAs substrate 64 has a 2 um buffer layer 66 followed by an N layer 68 and a highly doped N++ layer 70.

Figure 1:
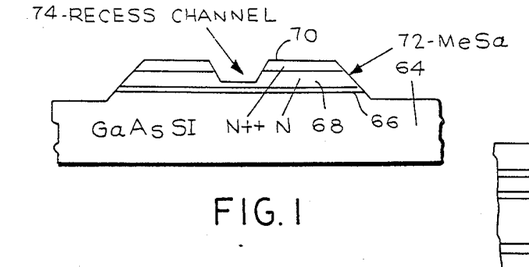
FIG. 1 is a cross sectional view of a MMIC circuit during its fabrication illustrating the result of steps of forming a mesa with a recess channel for later fabrication of an ARFET.

The first step, the result of which is FIG. 1, is to define the mesa 72 on which the FET will be fabricated and a recess channel 74 which will be the site of the gate.

Figure 2:
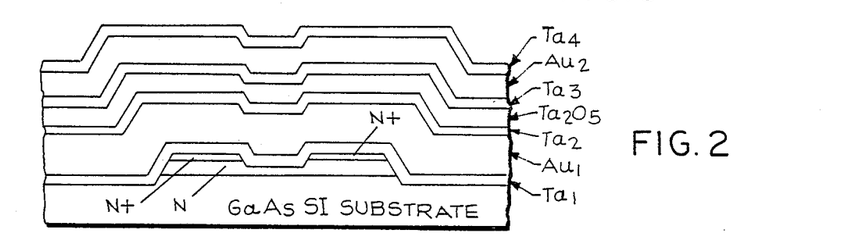
FIG. 2 is a cross sectional view of the MMIC circuit in which the lowest Au layer is of uniform thickness for all circuit elements, and illustrating the deposition of many layers of material on the circuit by evaporation and sputtering processes.

The structure of FIG. 2 results from the following steps:
(1) evaporate (or sputter) $Ta_1$ (1000 A)
(2) evaporate (or sputter) $Au_1$ (3.0 um)
(3) sputter deposit $Ta_2$ (200 A)
(4) sputter deposit $Ta_XO_Y$ (1500 A)
(5) sputter deposit $Ta_3$ (400 A)
(6) sputter $Au_2$ (1.5 um)
(7) sputter deposit $Ta_4$ (3000 A).

Figure 3:
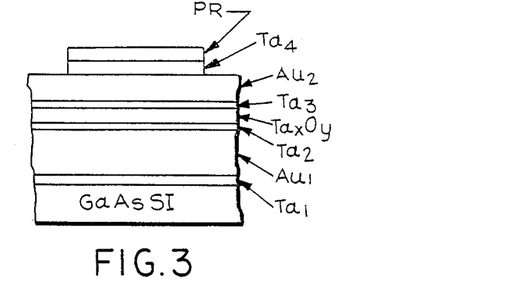
FIG. 3 is a cross section illustrating photoprocessing by masking and plasma etching.

The structure of FIG. 3 is produced by these steps:
(1) apply photoresist
(2) photoprocess for mask $IF_1$ (circuit pattern)
(3) plasma etch $Ta_4$ with $CF_4$, 100u, 300 w.

Figure 4:
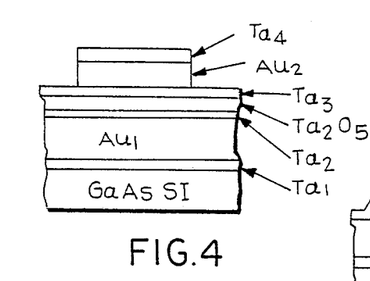
FIG. 4 is a portion of the circuit after removal of photoresist and following plasma etching.

The steps of FIG. 4 are:
(1) remove photoresist
(2) plasma etch $Au_2$ with $ArO_2$, 10u, 60 w. In this step $Ta_4$ is being oxidized by the $O_2$ in Ar and then used as a mask while gold is being etched by AR.

Figure 5:
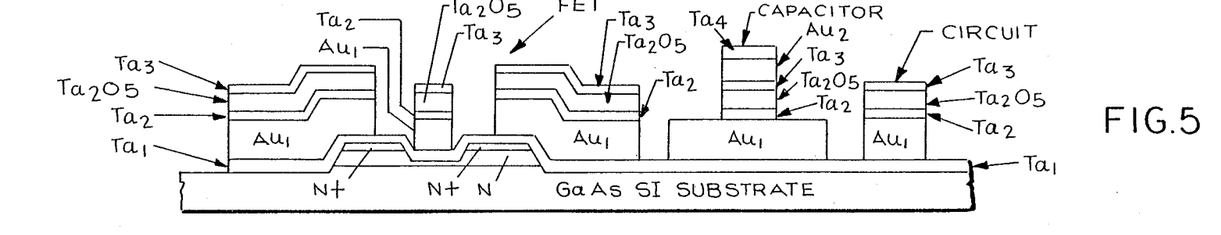
FIG. 5 results from application of photoresist and photoprocessing, plasma etching, and related steps.

In FIG. 5 some steps involved in producing a capacitor and circuit are illustrated as follows:
(1) apply photoresist
(2) photoprocess for mask $IF_2$ (capacitor electrode)
(3) plasma etch:
   $Ta_3$ with $CF_4$, 100u, 30 w
   $Ta_2O_5$ with $CF_4$, 100u, 30 w
   $Ta_2$ with $CF_4$, 100u, 30 w
(4) Remove photoresist
(5) plasma etch: $Au_1$ and $Au_2$ with $ArO_2$, 10u, 60 w
(6) measure capacitor values.

Figures 6, 7:
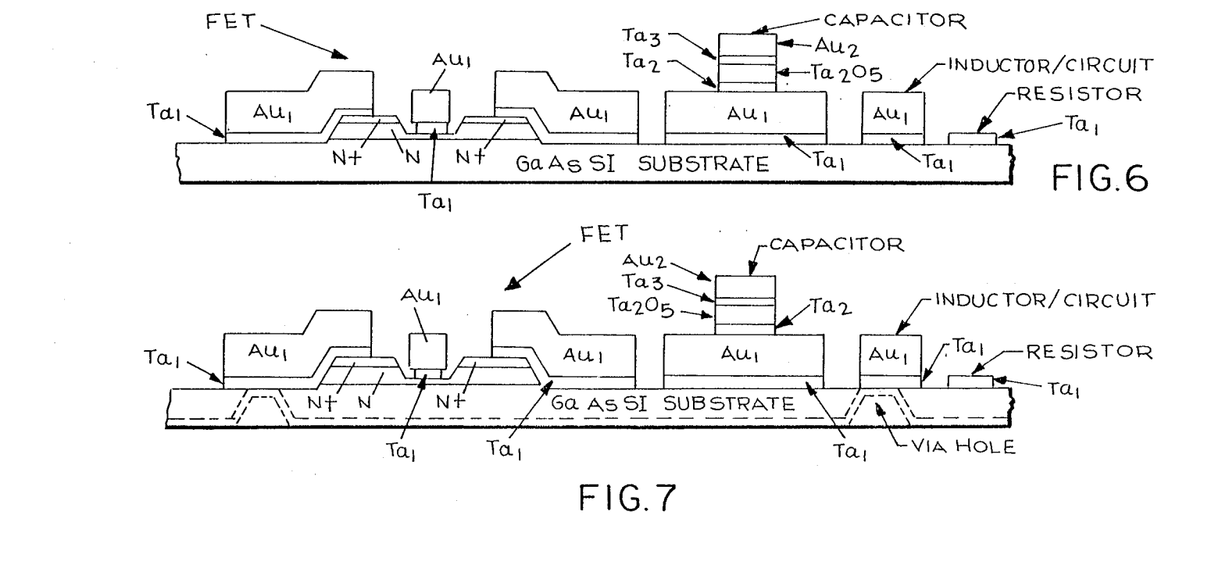
FIG. 6 shows further photoprocessing, and etching with Au cyanide to produce a resistor.
FIG. 7 shows the result of lapping of the wafer, photoprocessing, chemical etching via holes, and sputter deposition of gold.

In FIG. 6 the typical capacitor and circuit are further developed by means of the following steps, and completion of a resistor is portrayed. The steps are:
(1) apply photoresist
(2) photoprocess for mask $IF_4$ (resistor)
(3) etch Au over the resistor pattern with Au cyanide
(4) remove photoresist
(5) measure the resistor value.
(6) apply photoresist
(7) photoprocess for mask $IF_3$ (capacitor dielectric)
(8) plasma etch consecutively: $Ta_3$, $Ta_2O_5$, and $Ta_2$ with $CF_4$, 100u, 30 w $Ta_1$ with $CF_4$, 100u, 30 w
(9) remove photoresist
(10) define top Ta and Ta-Ta oxide.

FIG. 7 includes a lapping step:
(1) lap wafer to 5 mills
(2) apply photoresist
(3) photoprocess for mask $IF_5$ (via hole)
(4) chemically etch GaAs
(5) remove photoresist
(6) sputter deposit Ta (500 A) and Au (1000 A to 10,000 A)
(7) evaporate Au (2.0u).

Figure 8:
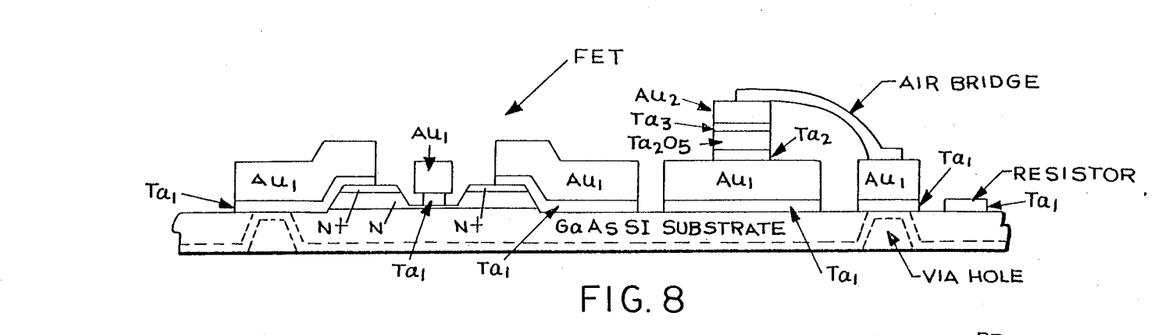
FIG. 8 shows masking, evaporation, photoprocessing and definition of an air bridge.

In FIG. 8 the air bridge is developed:
(1) apply photoresist
(2) photoprocess for mask $IF_6$ (first air bridge pattern)
(3) evaporate Au (3000 A) and Mo (300 A)
(4) apply photoresist
(5) photoprocess for mask $IF_7$ (second air bridge pattern)
(6) pulse plate Au (3 to 10u)
(7) remove photoresist and define the air bridge.

The ARFET makes it possible to produce nonalloyed ohmic contacts at room ambient temperature and therefore to fabricate active MMICs at room temperature. This increases yield, performance and reliability.

A problem with the MMIC of FIG. 8 is that when the gold layer $Au_1$ is thick enough to accommodate several skin depths of signal in the inductor and circuit network portions, it is too thick for good resolution of the gold overlayer of the source, gate and drain for the ARFET. This problem was solved by providing a buried tantalum layer over only the source, gate and drain portions of the ARFET and not over the circuit, capacitor, and other portions of the MMIC. FIGS. 9 through 19 show one embodiment of the ARFET having a buried layer and of a method for fabricating it.

The first step is to define the mesa and the recess channel for fabricating the ARFET; conventional methods are used with a result the same as that shown in FIG. 1.

Figure 9:
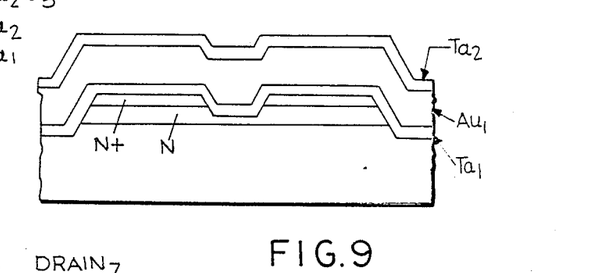
FIGS. 9, 10, and 11 show steps in producing a buried tantalum layer over contact areas of an FET.

FIG. 9 is the result of depositing a first tantalum layer $Ta_1$, a first gold layer $Au_1$, and a second tantalum layer $Ta_2$ by conventional methods on the structure of FIG. 1. The steps involved are:
(1) evaporate (or sputter) $Ta_1$ (1,000 A)
(2) evaporate (or sputter) $Au_1$ (3.0 um)
(3) sputter deposit $Ta_2$ (200 A)

Figure 10:
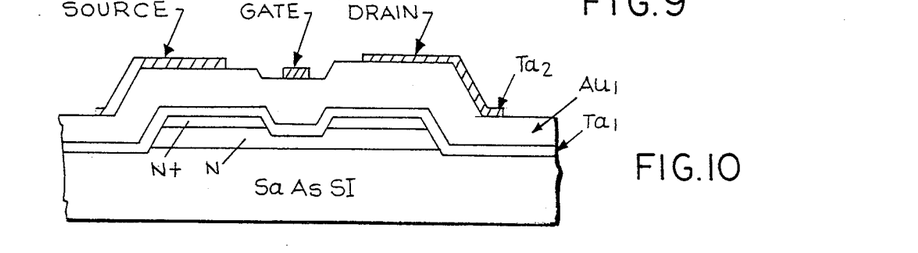

Conventional photolithographic methods are then employed to define a source, gate and drain in the $Ta_2$ layer as shown in FIG. 10. Additional gold is then deposited by evaporation or sputtering. It overlays the $Ta_2$ layer where that layer exists, but simply increases the thickness of the first gold layer $Au_1$ on portions of the circuit where the $Ta_2$ layer was removed.

Thereafter layers $Ta_3$, $Ta_2O_5$ (or similar compound), $Ta_4$, $Au_2$, and $Ta_5$ are deposited as follows:
(1) sputter deposit $Ta_3$ (200 A)
(4) sputter deposit $Ta_XO_Y$ (1,500 A)
(5) sputter deposit $Ta_4$ (400 A)
(6) sputter $Au_2$ (1.5 um)
(7) sputter deposit $Ta_5$ (3,000 A)

Figure 11:
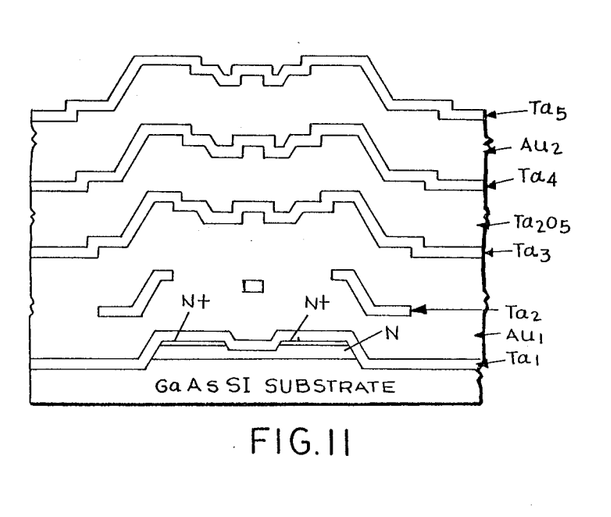

This produces a structure having the cross-section of FIG. 11.

Figure 12:
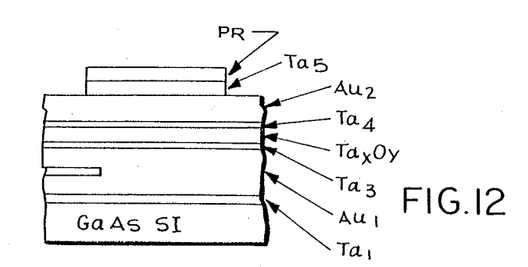
FIGS. 12 through 19 illustrate the top-down process for producing an MMIC in which the lowest Au layer is thinner for FET electrodes than for other circuit elements.
Figure 13:
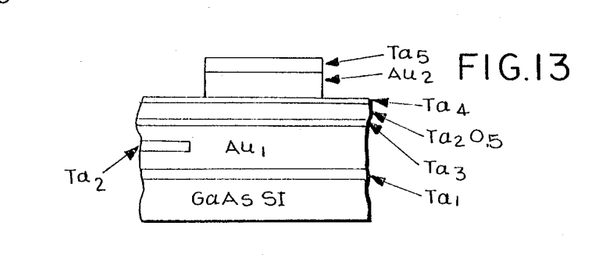
Figure 14:
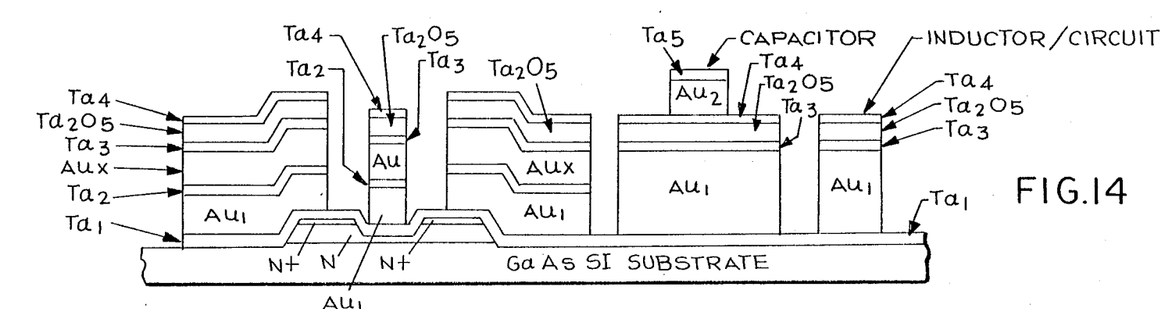

FIGS. 12 and 13 are produced in the same way as FIGS. 3 and 4 described above, but has the buried $Ta_2$ layer at selected places. FIG. 14 is produced by the same steps as FIG. 4. Note that because of the additional tantalum layer $Ta_2$, which is buried within the gold layer $Au_1$, the subscripts of the tantalum layers $Ta_2$, $Ta_3$, and $Ta_4$ of FIGS. 11 through 19 are increased to read $Ta_3$, $Ta_4$, and $Ta_5$ respectively.

Figure 15:
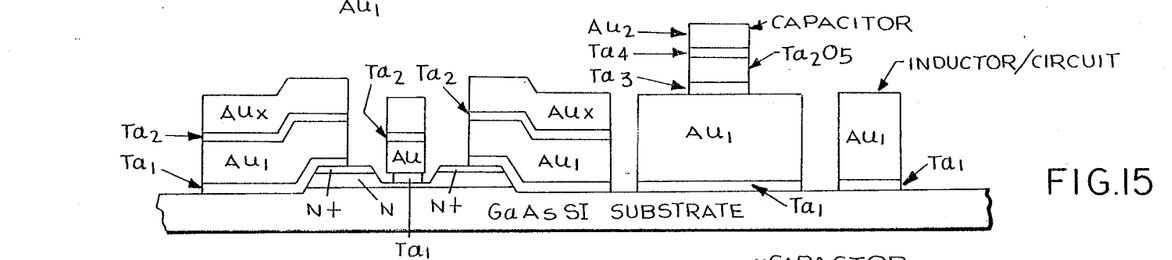
Figure 16:
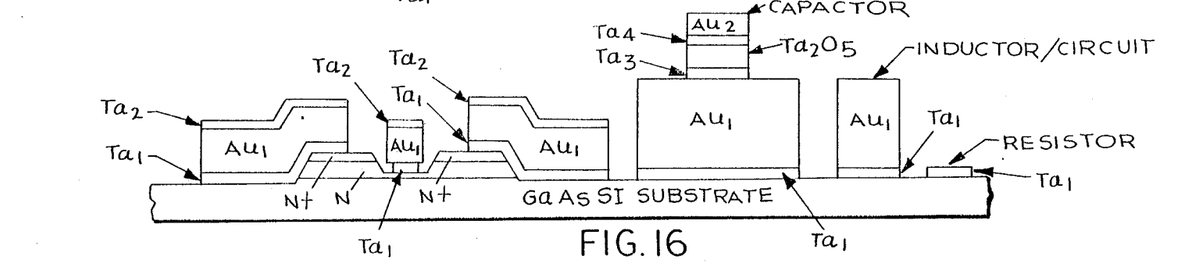

FIG. 15 is produced by steps 1, 2, 3, and 4 that are described in connection with FIG. 5, and FIG. 16 is the result of steps 5 and 6 that are employed to produce FIG. 5.

Figure 17:
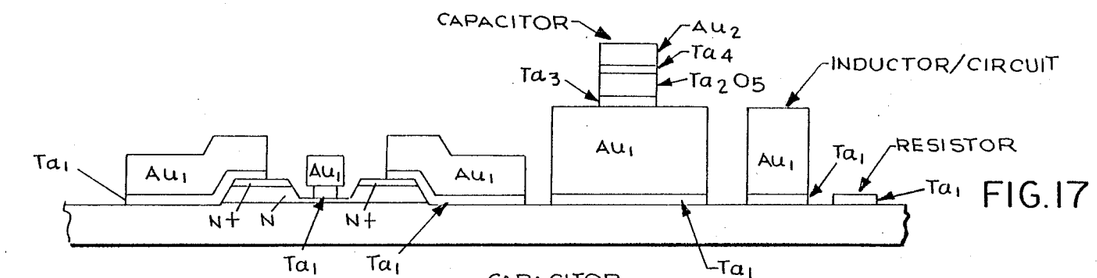
Figure 18:
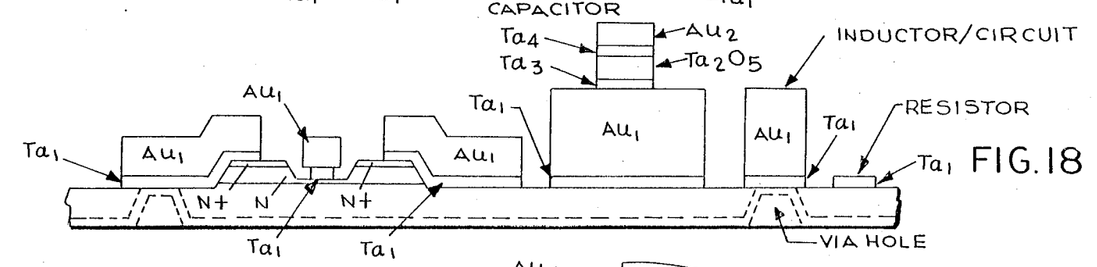
Figure 19:
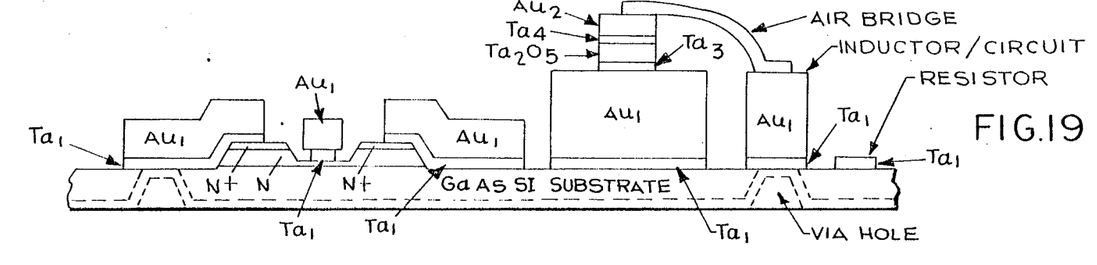

Next the tantalum layers $Ta_2$ and $Ta_1$ are removed as shown in FIG. 17. $Ta_2$ was employed to define those electrodes at a stratum low enough to be close to the electrodes themselves. The source and drain are nonalloyed ohmic contacts and the gate has a Schottky barrier. FIG. 18 is the result of lapping the underside of the wafer and other steps for producing the via holes that are shown in that figure, as described in connection with FIG. 7. FIG. 19 shows the circuit with an air bridge developed in accordance with the steps described in relation to FIG. 8.

An important thing to note about the MMIC that was produced by means of a buried tantalum layer is that the $Au_1$ layer over the source gate drain is much thicker than the $Au_1$ layer at the capacitor and at the circuit elements, as shown in FIG. 19. This made it possible to design this circuit to have higher performance than the corresponding circuit (FIG. 8) in which the $Au_1$ layer is the same thickness for all purposes across the circuit.

The ARFET makes it possible to produce nonalloyed ohmic contacts, and therefore to fabricate MMICs at room ambient temperature. This increases yields, performance and reliability. Using this technology a complete active monolithic microwave integrated circuit for use with signals of millimeter wavelengths can be fabricated.

Monolithic Mixer

Figure 20:
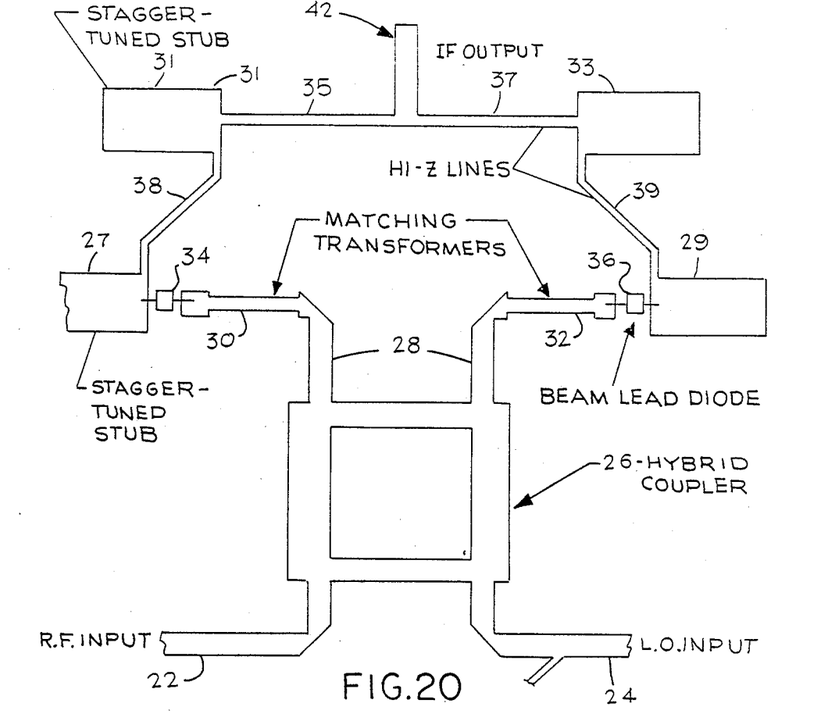
FIG. 20 is a layout diagram of a balanced 35 GHz MMIC mixer fabricated by the invented process.

By way of further example of the invented method, a monolithic mixer whose circuit layout is diagramed in FIG. 20 was fabricated. It includes a tantalum-gold-base distributed network comprising RF and local oscillator input lines 22, 24, feeding a hybrid coupler 26, and conductors 28 leading to diode-matching transformer elements 30, 32. Mixer diodes 34, 36 connect to tuning stubs 27, 29, and to high impedance transmission lines 38, 39. Additional stagger-tuned stubs 31, 33 are provided, and high impedance transmission lines 35, 37 conduct the signal to an IF output filter and an IF output point 42.

The steps in fabrication of the monolithic mixer were as follows:

(a) The mixer was fabricated on epitaxial N and N+ buffer layers grown on a SI GaAs substrate. The N and N+ layer thicknesses and carrier concentrations were 0.1 um and 1 um, and $3 \times 10^{16}$ per cm$^{-3}$ and $2 \times 10^{18}$ per cm$^{-3}$ respectively. (The symbol N+ is being used to indicate doping concentrations of $1 \times 10^{18}$ to $9 \times 10^{18}$ per cm$^3$, and N++ is used herein to indicate $1 \times 10^{19}$ to $2 \times 10^{20}$ per cm$^3$.)

(b) Define mesas by wet chemical etching to isolate the Schottky diodes' N and N+ layers from the circuit. The Schottky junctions were fabricated on mesas 3 microns high having two level mesa steps to improve dielectric and metallization step coverage.

Figure 21:
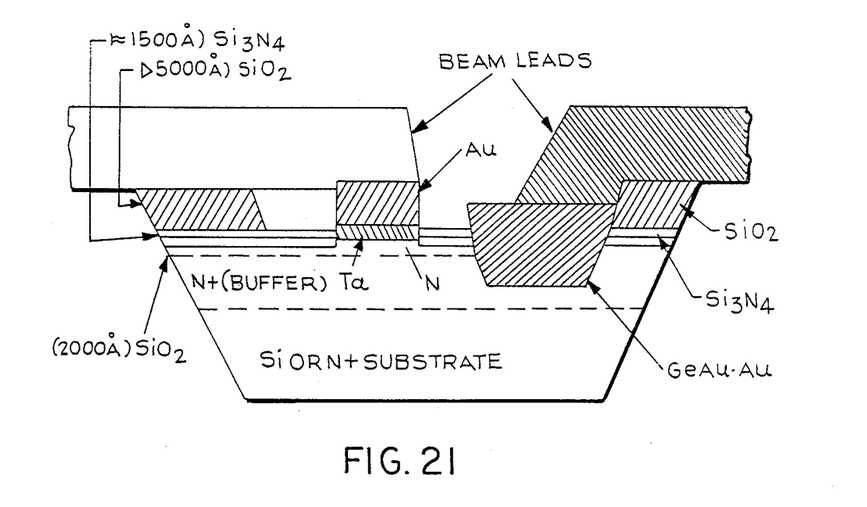
FIG. 21 is a conceptual diagram of the cross section of a Schottky diode of the design utilized in the the MMIC mixer.

(c) Define the Schottky junctions. Diodes 34, 36 of the mixer are beam lead Schottky barrier diodes whose structure and fabrication are described in detail in U.S. Pat. No. 4,301,233, issued Nov. 17, 1981, inventor Joseph A. Calviello, and assigned to the assignee of this invention. A 1500 A Ta layer with a 6000 A thick Au overlayer was used and the junction area was $1 \times 8$ um$^2$. Description of that prior art is not repeated in full detail here, but for convenience the basic concept of diodes of this type is shown in FIG. 21.

(d) The wafer surface outside the junction was sequentially covered with a sandwich layer $D_1$ comprising a 1000 A thick high vacuum deposited $SiO_2$, followed by an in situ sputter deposition of 3000 A $SiO_2$, 1500 A $Si_3N_4$ and 4000 A $SiO_2$. The high vacuum deposited $SiO_2$ was used to reduce crystal damage during the sputtering of the $SiO_2$ and $Si_3N_4$ dielectric layers. These dielectrics performed a dual role (a) as a passivating layer for the Schottky junctions and (b) to improve isolation between the circuit and the N and N+ layers, which were exposed at the edges of the mesas.

Figure 22:
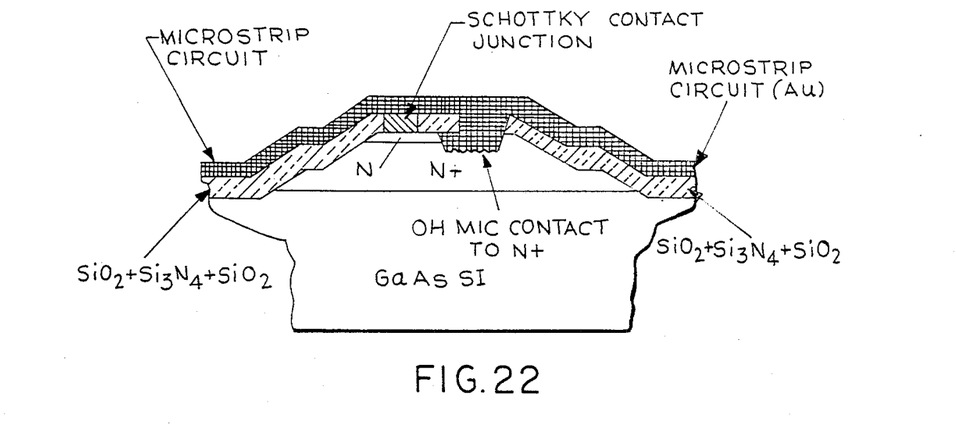
FIG. 22 shows more details of the mixer diode as embodied in the actual circuit.

(e) Using $CF_4/O_2$, a power density of 0.5 W/cm$^2$ and 100 um gas pressure, the $SiO_2$, $Si_3N_4$ and $SiO_2$ layers were etched in order to open windows for ohmic contacts to the underlying N+ layer. FIG. 22 is a simplified diagram of one of the Schottky diodes of the present balanced mixer example.

(f) The ohmic contacts were produced by lift-off of high vacuum deposited GeAu-Au (1500 A-5000 A), and rapid alloying.

Figure 23A:
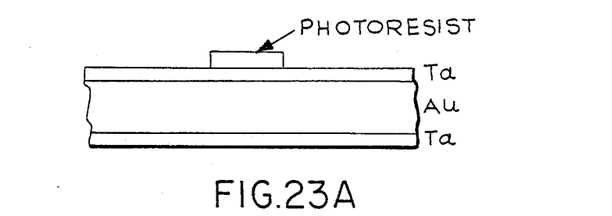
FIGS. 23A through 23D show deposition of $Ta_1$, $Au_1$ and $Ta_2$, definition of a circuit in $Ta_2$, etching of $Au_1$, and etching of $Ta_1$ and $Ta_2$ in the fabrication of a distributed network portion of the MMIC mixer.
Figure 23B:
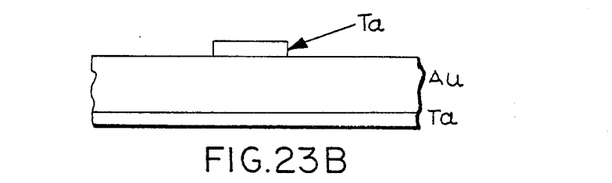

(g) Layers of 1000 A Ta (referred to in FIG. 23A as $Ta_1$), 30,000 A Au and 2000 A Ta ($Ta_2$) were sputter deposited over the full surface, in order that the distributed network circuit could be developed atop the above-described dielectric sandwich layer.

Figure 23C:
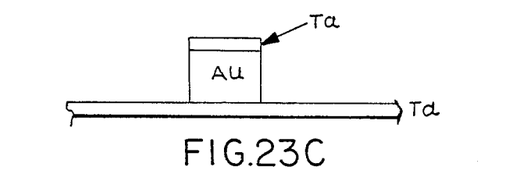
Figure 23D:
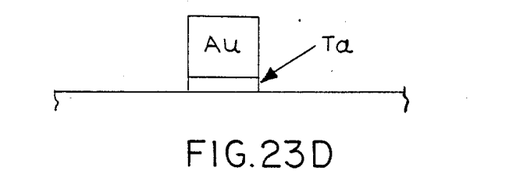

(h) The distributed network was defined using the processing steps shown in FIGS. 23A, 23B, 23C, and 23D. The intermediate stage of FIG. 23A was achieved by depositing $Ta_1$, Au, and $Ta_2$, then applying photoresist and a lithographic process. The stage depicted in FIG. 23B results from etching the top layer of $Ta_2$ with $CF_4$ and removing the photoresist. In FIG. 23C, the Au has been etched with $Ar/O_2$. FIG. 23D completes the definition in Au of the distributed circuits of FIG. 20 by etching of the $Ta_1$ and $Ta_2$ layers with $CF_4/O_2$.

(i) The final step was the formation of air bridges as described in the earlier circuit examples herein, for completing the electric connections between the ohmic contacts and the distributed network.

Much more complex circuits can be fabricated by the same techniques, including overlaying capacitors, tantalum resistors, lumped inductors, etc., as in the ARFET circuit example. They require the deposition initially of more layers of metals, oxides, etc., before the process is begun of defining circuits elements from the top down.

The yield of monolithic mixers fabricated by this method was between 75% and 80%. The RF performance included a SSB conversion loss of 5.3 db and excess noise ratio of less than 1.0.

Circuits and a method have been developed involving processes, metallurgy and oxides that are common to the fabrication of active devices, passive elements and interconnecting circuits. The method makes possible the fabrication largely in situ of cost effective monolithic integrated circuits, including ones suitable for microwave and millimeter use.

Also, the use of this top-down method of fabrication to make quasi-monolithic microwave integrated circuits (QMMICs, having only passive elements, to which active devices are later bonded), makes it possible to optimize processes and circuit performance which enable later fabrication of superior MMICs. A particular design of MMIC that includes active devices can be created by first developing a QMMIC, then developing the MMIC with similar substrate, metallurgy and processes. QMMIC fabrication methods are illustrated and claimed in copending application Ser. No. 07/040,416 filed Apr. 20, 1987 in the names of Joseph A. Calviello, Paul R. Bie and Ronald J. Pomian and assigned to the assignee of this invention.

In the case of MMICs, fabrication by the invented method is inexpensive enough to be adaptable not only to analog systems and low scale integration, but also to high speed logic systems and large scale integration.

Most components of the circuits are individually testable by well known testing techniques, for example by using probes. The active devices are testable at multiple stages of the fabrication process.

Although others have produced nonalloyed ohmic contacts using highly doped N+ layers, to our knowledge they have not previously successfully fabricated MESFETS of good performance using such contacts for source and drain), produced in connection with a top-down process.

We claim:

1. A method for producing a monolithic integrated circuit comprising the steps of:

A. providing a substrate having a doped layer followed by a highly doped layer on at least a selected area of the substrate intended for siting an active device;

B. enclosing the substrate in an environmentally isolated chamber;

C. providing over a substantial portion of a surface of the substrate at least five superimposed layers of metals and compounds, wherein said metals include at least one from the group tantalum, molybdenum, tungsten, and gold, and wherein said compounds include at least one from the group of oxides of tantalum, molybdenum, and tungsten and silicon nitride, wherein all of said at least five superimposed layers are formed in situ in the same said chamber without removal from said chamber;

D. removing the circuit from said chamber; and

E. by processing including photolithography, sequentially processing patterned areas of said layers substantially from the exposed top layer downward, to define circuit elements forming a substantially complete integrated circuit including the active device.

2. A method as in claim 1 and wherein step A comprises:
U. epitaxially growing a doped N layer;
V. epitaxially growing a highly doped N layer;
W. defining the selected area by defining a mesa intended for the location of a MESFET on said substrate;
X. defining a recess for the location of an active gate channel and for separating areas intended for source and drain;
Y. defining source, gate and drain areas photolithographically on said mesa.

3. A method as in claim 2 and further comprising the following step before step U:
T. epitaxially growing a buffer layer on said area.

4. A method as in claim 1, 2 or 3 and wherein the order of defining the circuit elements of step E includes (a) defining capacitors, (b) defining circuit conductors, and (c) defining resistors.

5. A method as in claim 4 and wherein said circuit elements comprise both distributed and lumped circuit elements.

6. A method as in claim 1, 2, or 3 and wherein said integrated circuit comprises a substrate of semi-insulating GaAs.

7. A method as in claim 1, 2, or 3 and wherein said integrated circuit comprises a substrate of insulating Si and a layer of GaAs.

8. A method as in claim 2 and wherein said step A comprises growing and defining a Schottky barrier for a gate and nonalloyed ohmic contacts for source and drain of said MESFET.

9. A method as in claim 1 and wherein said step C of providing superimposed layers of metals and compounds comprises providing a layer of a compound selected from the group $Ta_2O_5$, $SiO_2$, and $Si_3N_4$.

10. A method as in claim 1 and wherein said circuit elements comprise a layered capacitor on SI GaAs substrate and said step of providing said layers comprises providing them by the following procedures:
providing a first Ta layer;
providing a first Au layer;
sputter depositing a second Ta layer;
sputter depositing $Ta_XO_Y$ where X and Y are integers;
sputter depositing a third Ta layer;
sputter depositing a second Au layer;
sputter depositing a fourth Ta layer.

11. A method as in claim 10 and wherein X is 2 and Y is 5.

12. A method as in claim 11 and wherein said step of sequentially processing patterned areas comprises defining a layered capacitor on SI GaAs substrate as follows:
(i) photolithographically defining a first electrode for a capacitor in said second Au layer by the following procedures
apply photoresist;
photoprocess for a first mask;
plasma etch said fourth Ta layer with $CF_4$;
remove photoresist;
plasma etch said second Au layer with $ArO_2$; and,
(ii) photolithographically defining a second electrode in said first Au layer by the following procedures
apply photoresist;
photoprocess for a second mask;
plasma etch said third Ta layer and said $Ta_XO_Y$ layer and said second Ta layer with $CF_4$;
remove photoresist; and
plasma etch said first and second Au layers with $ArO_2$.

13. A method as in claim 1 and wherein all of said metals and compounds are refractory types.

14. A method for producing a monolithic integrated circuit comprising the steps of:
A. isolating for the site of an active device an area of a substrate having a doped layer of N material covered by a highly doped layer of N material;
B. depositing a first layer of Ta thereover;
C. depositing a layer of Au thereover;
D. depositing a second layer of Ta thereover;
E. photolithographically removing portions of said second Ta layer and leaving configured other portions of it at least at said selected active device area;
F. enclosing the substrate in an environmentally isolated chamber;
G. depositing another layer of Au over (a) the remaining portions of said second Ta layer and (b) said first Au layer at said other portions wherein said second Ta layer was removed, to bury said configured Ta layer within the gold;
H. providing over a substantial portion of a surface of the substrate at least five more superimposed layers of metals and compounds, wherein said metals include at least one from the group tantalum, molybdenum, tungsten, and gold, and wherein said compounds include at least one from the group of oxides of tantalum, molybdenum, and tungsten, and silicon nitride;
I. removing the circuit from said chamber;
J. sequentially processing patterned areas of said layers substantially from the exposed top layer downward, to define circuit elements forming a substantially complete integrated circuit including the active device, by processes including photolithography;
K. wherein said step J comprises removing said portions of the layer of Au that overlie said buried Ta layer item (a) of step G, and leaving in place said layer of Au that was at said other portions, item (b) of step G.

15. A method as in claim 14 and wherein the order of performing steps F and G is reversed.

16. A method as in in claim 14 and wherein step E comprises photolithographically defining contacts for all three of the elements source, gate and drain, of an FET by means of the same mask.

17. A method as in claim 14 and wherein said circuit elements comprise a layered capacitor on SI GaAs substrate and said step H of providing said layers comprises providing them by the following procedures:
providing a third Ta layer;
sputter depositing Ta$_X$O$_Y$ where X and Y are integers;
sputter depositing a fourth Ta layer;
sputter depositing a second Au layer;
sputter depositing a fifth Ta layer.

18. A method as in claim 17 and wherein said step of providing a third Ta layer comprises providing by an evaporation process.

19. A method as in claim 17 and wherein X is 2 and Y is 5.

20. A method as in claim 14 and wherein all of said metals and compounds are refractory types.

21. A method for producing a monolithic integrated circuit comprising the steps of:
A. providing a doped layer followed by a highly doped layer on a substrate on a selected area intended for an active device;
B. enclosing the substrate in an environmentally isolated chamber;
C. providing over a substantial portion of a surface of the substrate at least seven superimposed layers of metals, oxides and nitrides, wherein said metals include at least one from the group tantalum, molybdenum, tungsten, and gold, and wherein said oxides include at least one from the group of oxides of tantalum, molybdenum, and tungsten, wherein all of said at least seven superimposed layers are formed in situ in the same said chamber without removal from said chamber;
D. removing the circuit from said chamber; and
E. sequentially processing patterned areas of said layers substantially from the exposed top layer downward, to define circuit elements forming a substantially complete integrated circuit including the active device, by processes including photolithography.

22. A method as in claim 21 and wherein step A comprises forming in the following manner layers to be used in defining a MESFET:
U. epitaxially growing the doped N active layer;
V. epitaxially growing the highly doped N layer;
W. defining a mesa intended for the location of the MESFET at said selected area;
X. defining a recess for the location of an active gate channel and for separating areas intended for source and drain;
Y. defining source, gate and drain areas photolithographically on said mesa.

23. A method as in claim 22 and further comprising the following step before step U:
T. epitaxially growing a buffer layer on said selected area.

24. A method as in claim 21, 22 or 23 and wherein the order of producing the circuit elements of step E includes (a) defining capacitors, (b) defining circuit conductors, and (c) defining resistors.

25. A method as in claim 24 and wherein said circuit elements comprise both distributed and lumped circuit elements.

26. A method as in claim 21, 22 or 23 and wherein said integrated circuit comprises a substrate of SI GaAs.

27. A method as in claim 21, 22 or 23 and wherein said integrated circuit comprises a substrate of insulating Si and a layer of GaAs.

28. A method as in claim 22 and wherein said step A comprises growing and defining a Schottky barrier for a gate and nonalloyed ohmic contacts for source and drain of said MESFET.

29. A method as in claim 21 and wherein said step of providing superimposed layer of metals and compounds comprises providing layers which include at least one compound selected from the group Ta$_2$O$_5$, SiO$_2$, and Si$_3$N$_4$.

30. A method as in claim 21 and wherein all of said metals and compounds are refractory types.

31. A method for producing a monolithic integrated circuit comprising the steps of:
A. providing a doped layer of N material followed by a highly doped layer of N material on at least an area of a substrate selected for locating an active device;
B. depositing a first layer of Ta thereover;
C. depositing a layer of Au thereover;
D. depositing a second layer of Ta thereover;
E. photolithographically removing portions of said second Ta layer and leaving configured other portions of it at least at said selected active device area;
F. enclosing the substrate in an environmentally isolated chamber;
G. depositing another layer of Au over (a) the remaining portions of said second Ta layer and (b) said first Au layer at said other portions where said second Ta layer was removed, to bury said configured Ta layer within the gold;
H. providing over a substantial portion of a surface of the substrate at least seven superimposed layers of metals and compounds, wherein said metals include at least one from the group tantalum, molybdenum, tungsten, and gold, and wherein said compounds include at least one from the group of oxides of tantalum, molybdenum, tungsten, and silicon nitride;
I. removing the circuit from said chamber; and
J. sequentially processing patterned areas of said layers substantially from the exposed top layer downward, to define circuit elements forming a substantially complete integrated circuit including the active device, by processes including photolithography;
K. wherein said step J comprises selectively removing said portions of the layer of Au that overlie said buried Ta layer item (a) of step G, and leaving said layer of Au that was at said other portions, item (b) of step G.

32. A method as in in claim 31 and wherein said step E comprises photolithographically defining contacts for all three of the elements source, gate, and drain, of said FET by means of the same mask.

33. A method as in claim 31 and wherein the order of performing steps F and G is reversed.

34. A method as in claim 31 and wherein said circuit elements comprise a layered capacitor on SI GaAs substrate and said step of producing said layers comprises producing them by the following procedures:
producing a third Ta layer;
sputter depositing Ta$_X$O$_Y$ where X and Y are integers;
sputter depositing a fourth Ta layer;
sputter depositing a second Au layer;

sputter depositing a fifth Ta layer.

35. A method as in claim 34 and wherein at least one of said steps of providing layers comprises providing by an evaporation process.

36. A method as in claim 34 and wherein at least one of said steps of providing layers comprises providing by a sputtering process.

37. A method as in claim 34 and wherein said step of sequentially processing patterned areas comprises defining a layered capacitor on SI GaAs substrate as follows:
  (i) photolithographically defining a first electrode for a capacitor in said second Au layer by the following procedures
    apply photoresist;
    photoprocess for a first mask;
    plasma etch said fifth Ta layer with $CF_4$;
    remove photoresist;
    plasma etch said second Au layer with $ArO_2$; and,
  (ii) photolithographically defining a second electrode in said first Au layer by the following procedures
    apply photoresist;
    photoprocess for a second mask;
    plasma etch said fourth Ta layer and said $Ta_xO_y$ layer and said third Ta layer with $CF_4$;
    remove photoresist; and
    plasma etch said first and second Au layers with $ArO_2$.

38. A method as in claim 34 and wherein X is 2 and Y is 5.

39. A method as in claim 31 and wherein all of said metals and compounds are refractory types.

* * * * *